United States Patent
Tan et al.

(10) Patent No.: US 10,483,358 B2
(45) Date of Patent: Nov. 19, 2019

(54) SEMICONDUCTOR CELL STRUCTURE AND POWER SEMICONDUCTOR DEVICE

(71) Applicant: No. 24 Research Institute of China Electronics Technology Group Corporation, Chongqing (CN)

(72) Inventors: Kaizhou Tan, Chongqing (CN); Gangyi Hu, Chongqing (CN); Zhaohuan Tang, Chongqing (CN); Jianan Wang, Chongqing (CN); Yonghui Yang, Chongqing (CN); Yi Zhong, Chongqing (CN); Yang Cao, Chongqing (CN); Yong Liu, Chongqing (CN); Kunfeng Zhu, Chongqing (CN)

(73) Assignee: NO. 24 RESEARCH INSTITUTE OF CHINA ELECTRONICS TECHNOLOGY GROUP CORPORATION, Nan'an District, Chongqing (CN)

( * ) Notice: Subject to any disclaimer, the term of this patent is extended or adjusted under 35 U.S.C. 154(b) by 0 days.

(21) Appl. No.: 16/068,098

(22) PCT Filed: Apr. 1, 2016

(86) PCT No.: PCT/CN2016/078270
§ 371 (c)(1),
(2) Date: Jul. 3, 2018

(87) PCT Pub. No.: WO2017/152443
PCT Pub. Date: Sep. 14, 2017

(65) Prior Publication Data
US 2019/0027563 A1  Jan. 24, 2019

(30) Foreign Application Priority Data

Mar. 8, 2016 (CN) .......................... 2016 1 0131447

(51) Int. Cl.
*H01L 29/40* (2006.01)
*H01L 29/78* (2006.01)
(Continued)

(52) U.S. Cl.
CPC ...... *H01L 29/405* (2013.01); *H01L 21/02057* (2013.01); *H01L 21/0262* (2013.01);
(Continued)

(58) Field of Classification Search
CPC ............. H01L 29/405; H01L 29/66136; H01L 29/0634; H01L 29/36; H01L 29/0696;
(Continued)

(56) References Cited

U.S. PATENT DOCUMENTS 6,307,246 B1 * 10/2001 Nitta .................. H01L 29/7813
257/493
6,445,019 B2 * 9/2002 Van Dalen ............ H01L 29/404
257/217

(Continued)

FOREIGN PATENT DOCUMENTS

| CN | 101510557 A | 8/2009 |
|---|---|---|
| CN | 102117830 A | 7/2011 |
| CN | 103236439 A | 8/2013 |

*Primary Examiner* — Victor A Mandala
(74) *Attorney, Agent, or Firm* — Global IP Services; Tianhua Gu

(57) ABSTRACT

A semiconductor cell structure and power semiconductor device, wherein, the semiconductor cell structure includes: a highly-doped semiconductor material region, an epitaxial layer, a dielectric insulating layer, a semi-insulating material, and an active device region, a deep groove is further etched on the epitaxial layer, the deep groove vertically extends into the highly-doped semiconductor material region, the dielectric insulating layer is formed on a side wall inside the deep groove, and the deep groove is filled with the semi-insulating material. The cell structure can be applied to the power semiconductor device during actual
(Continued)

application, the present invention dramatically reduces the difficulty of the process implementation, relaxes the harsh requirements on charge balance, broadens the tolerant charge mismatch percentage by approximately ten times, and also improves the long-term reliability of normal operation of the device cell at the same time.

7 Claims, 5 Drawing Sheets

(51) Int. Cl.
| | |
|---|---|
| *H01L 29/861* | (2006.01) |
| *H01L 21/02* | (2006.01) |
| *H01L 29/06* | (2006.01) |
| *H01L 29/10* | (2006.01) |
| *H01L 29/36* | (2006.01) |
| *H01L 29/872* | (2006.01) |
| *H01L 29/66* | (2006.01) |
| H01L 21/311 | (2006.01) |
| H01L 21/321 | (2006.01) |
| H01L 21/3213 | (2006.01) |

(52) U.S. Cl.
CPC .. *H01L 21/02271* (2013.01); *H01L 21/02532* (2013.01); *H01L 21/02595* (2013.01); *H01L 29/0634* (2013.01); *H01L 29/0696* (2013.01); *H01L 29/1095* (2013.01); *H01L 29/36* (2013.01); *H01L 29/66136* (2013.01); *H01L 29/78* (2013.01); *H01L 29/7811* (2013.01); *H01L 29/861* (2013.01); *H01L 29/872* (2013.01); *H01L 21/0223* (2013.01); *H01L 21/02255* (2013.01); *H01L 21/31116* (2013.01); *H01L 21/3212* (2013.01); *H01L 21/32135* (2013.01); *H01L 29/407* (2013.01)

(58) Field of Classification Search
CPC ......... H01L 21/02057; H01L 21/02271; H01L 21/02532; H01L 21/02595; H01L 29/1095; H01L 21/0262; H01L 29/872; H01L 29/7811; H01L 29/861; H01L 29/78; H01L 29/32135; H01L 21/02255; H01L 21/0223; H01L 29/407; H01L 21/3212; H01L 21/31116
See application file for complete search history.

(56) References Cited

U.S. PATENT DOCUMENTS

| | | | |
|---|---|---|---|
| 8,946,814 | B2 | 2/2015 | Anderson et al. |
| 10,325,980 | B2 * | 6/2019 | Darwish ............. H01L 29/0611 |
| 2002/0070418 | A1 | 6/2002 | Kinzer et al. |
| 2014/0054741 | A1 * | 2/2014 | Darwish ............. H01L 29/0611 |
| | | | 257/487 |
| 2014/0264619 | A1 * | 9/2014 | Sugiura ............... H01L 29/0696 |
| | | | 257/368 |

* cited by examiner

SEMICONDUCTOR CELL STRUCTURE AND POWER SEMICONDUCTOR DEVICE

CROSS REFERENCE TO RELATED APPLICATION

The present application is the U.S. national stage of PCT/CN2016/078270 on Apr. 1, 2016, which claims the priority of the Chinese patent application No. CN2016101314471 filed on Mar. 8, 2016, which application is incorporated herein by reference.

BACKGROUND OF THE PRESENT INVENTION

Field of Invention

The present invention relates to the field of semiconductor device and integrated circuit technologies, specifically to a semiconductor cell structure of a high-voltage and low-drift region on-resistance.

Description of Related Arts

Currently, for a semiconductor device, especially a high-voltage silicon power device, optimization design of a breakdown voltage and on-resistance of a drift region bearing a withstand voltage is mutually influential and contradictory. Generally, it is quite difficult to obtain low on-resistance while a high breakdown voltage is obtained. Certainly, a case in which a minority carrier or non-equilibrium dual carrier modulation exists in the drift region bearing a withstand voltage when a device is on is not included, for example, devices such as an IGBT (Insulated Gate Bipolar Transistor), a PIN (P-I-N diode), and a GTO (Gate Turn-Off Thyristor). Generally, in a high-voltage semiconductor silicon device of over 100 V, a large part of on-resistance is occupied by a high-voltage drift region of the device. This situation becomes more and more serious with the increase of an operating voltage. This is the most famous silicon theoretical limit of a non-modulated power device in which the $2.5^{th}$ power of a breakdown voltage is proportional to drift region on-resistance.

In order to reduce drift region on-resistance of a non-modulated power device at a high voltage, for more than a decade, the industry has proposed some methods and device cell structures for reducing on-resistance while maintaining the breakdown voltage constant for a conventional device cell structure. The most famous device is a device of a super junction structure improved based on the RESURF two-dimensional electric field principle and the charge balance principle. Wherein, a VDMOS power device named CoolMOS™ from Infineon Technologies commercializes the structure. Such a device forms a PN junction approximately parallel to the flow direction of the current through epitaxy for more than three times and location impurity injection for corresponding times, and strictly requires the total quantities of impurities of the PN junction in a direction perpendicular to the current to be equal and achieve space depletion charge balance. Only in this way can the highest voltage be adequately borne, and can a voltage drop generated when a current flows through the drift region be reduced, and can the theoretical limit of an ordinary one-dimensional parallel-plane PN junction drift region on-resistance and the $2.5^{th}$ power of a withstand voltage be better broken. However, such a process implementation has large difficulty and high costs.

In addition, there are many new implementation methods and equivalent structure technical solutions based on a super junction theory in the prior art. Solutions that can be industrially implemented in these technologies are mainly structures and methods characterized by a deep groove. Especially, oblique injection and epitaxial filling after the deep groove are relatively close to the super junction theory, and it is relatively easier to implement the oblique injection and epitaxial filling.

In general, all cores in the prior art are based on a two-dimensional theory of the super junction and are also consistent with the RESURF principle. The core demand is that if a two-dimensional semiconductor is to bear a voltage higher than that of a parallel-plane junction in a certain direction, and drift region on-resistance may be further reduced at the same time, a PN junction needs to be formed on a side surface of the semiconductor in a direction parallel to the current, and it is also required that the PN junction is fully depleted on both sides and can exactly reach a charge balance when the device bears the high voltage, while an impurity concentration or a space depletion layer charge satisfies the RESURF condition. In a rare case, a fixed and uniform charge in an insulator such as an oxide layer may be used to replace a space depletion layer charge that is at one side of the PN junction and that does not join in electric conduction.

Using FIG. 1 as an example to synthetically describe features in the prior art and problems or shortcomings of implementing the features. FIG. 1 is a highly-summarized schematic diagram of a high-voltage low-conduction cell structure in the prior art. As shown in the figure, a region 1 in the figure is a drift region bearing a high voltage when a device is turned off and is also a current channel when the device is turned on. A region 6 is an active region of the device, and may be a gate and channel region of a VDMOS, or may simply be a primary functional region such as a Schottky or high-voltage PN junction diode junction region of the device. A region 7 is a high-voltage and highly-doped region of the device, and may be a drain region of the VMDOS, or a highly-doped high-voltage electrode region with low resistance of a Schottky or PN junction diode.

It can be learned that, the active region in FIG. 1 (that is, the region 6), the drift region (that is, the region 1), and the high-voltage electrode region (that is, the region 7) form basic functional elements of such type of high-voltage power devices, and are a basic core structure that is of a high-voltage device based on an ordinary one-dimensional parallel-plane PN junction and that can independently operate. The drift region 1 is exactly a contradictory focus between a high voltage and a low on-resistance in such type of devices, because the drift region bears a high voltage in a reverse direction and becomes an inevitable way for a current during forward conduction.

In order to further improve device performance, that is, performance of a higher voltage and a lower on-resistance, the RESURF principle and a super junction charge balance two-dimensional effect mechanism are used. Existing technologies basically use a basic solution in which a region 2 whose impurity type of a current side is opposite to that of the drift region 1 is added in FIG. 1, and the so-called super junction is formed by the region 2 and the drift region 1 of the device. Such a solution is a first-generation high-voltage power semiconductor device that is based on the super junction theory and that breaks the theoretical limit of parallel-plane PN junction on-resistance and the $2.5^{th}$ power of a withstand voltage. CoolMOS™ is a typical representative of such a structure and has been industrially implemented.

In addition, a few existing technical solutions further propose to use a charge in an insulating dielectric to equal or replace the region 2, for example, a charge 3 in the insulating dielectric in FIG. 1. In addition to the region 1, region 2, and region 3 in FIG. 1, some existing technical device cell structures further have some secondary additional structures, for example, region 4 and region 5 in FIG. 1, which are usually formed by a semi-insulating layer such as polycrystal and an oxide layer, and an insulating layer such as silicon nitride in an independent or combination manner. Mostly, the region 4 is formed by using a process technology of a deep groove as a feature, and the region 5 is generally deformation of some structures on a bottom portion of a deep groove 4. Usually, only the region 4 exists and the region 5 does not exist or is not required.

However, the existing technical solutions involved above have the following difficulties or shortcomings in the process implementation of the device structure:

1) For a technical solution in which a device cell structure does not have the region 4 and the region 5, it is difficult to control charge balance between the region 1 and the region 2. Generally, according to the RESURF principle, when silicon is at a voltage range of 100 V to 10000 V, a charge number surface density required by charge balance between the region 1 and the region 2 ranges from $1 \times 10^{12}$ cm$^{-2}$ to $2 \times 10^{12}$ cm$^{-2}$. A higher voltage indicates a stricter requirement. 10% change of the density is only from $1 \times 10^{11}$ cm$^{-2}$ to $2 \times 10^{11}$ cm$^{-2}$. For such charge control, persons having manufactured a semiconductor in this industry understand control difficulty of the range. Such a variation causes a super junction device of about 800 V to change by approximately 150 V. Therefore, a little conduction performance of an actual commercialized device usually needs to be sacrificed to balance a contradiction between breakdown and conduction characteristics, considering that the impact of a change of domain CD during a process also increases process implementation difficulty of a super junction device.

2) For a solution in which a device cell structure has the region 4 and region 5, similar to the case in which the region 4 and region 5 do not exist, it is still difficult to control charge balance between the region 1 and the region 2. In addition, when an insulating dielectric exists in the region 4 and (or) the region 5, an insulating dielectric layer interface charge or a fixed charge in an insulating dielectric is generally inevitably introduced into, and typically, for example, a fixed oxide charge in an oxide layer. There are relatively few fixed charges in a relatively thin oxide layer. For a thermal oxide layer of 20 nm or more, oxide charges in the thermal oxide layer generally range from $3 \times 10^{10}$ cm$^{-2}$ to $2 \times 10^{11}$ cm$^{-2}$. Certainly, when a process control level is relatively good, such charges are controllable and have great repeatability. Even so, for a high-voltage power device, an operating environment for the device is usually severe, and it is inevitable that the device is interfered by a spike voltage. This easily leads to charge injection or degradation of the oxide layer, and consequently, a super junction loses charge balance and stability of operation of the high-voltage device is affected.

3) For a rare case in which a charge in an insulating layer is used to replace the region 2 in FIG. 1 to form a super junction with the active functional region 1, on one hand, the impact of an uncertain charge peculiar to the foregoing general insulating layer still exists. On the other hand, an insulating layer charge currently used in the insulating layer generally uses metal cesium, belonging to alkali metals and being poorly compatible with a semiconductor silicon process.

4) In addition, in the prior art, there are currently two methods to implement a process solution that is relatively easy to implement and that uses a deep groove as a process feature, to be specific, large tilt angle ion implantation and a direct epitaxy method.

Wherein, the large tilt angle may use the high dose accuracy of ion implantation, but the accuracy of the tilt angle and the accuracy of equivalent impurity surface density ranging from $1 \times 10^{10}$ cm$^{-2}$ to $1 \times 10^{11}$ cm$^{-2}$ are pretty challenging. In addition, how to satisfy a requirement of a contemporary plane integration process and seal a deep groove without causing charge fluctuation in a super junction structure system is also a difficulty of process implementation. If the deep groove is sealed by using a dielectric layer, it is a difficult to control a charge in the dielectric insulating layer, and a redundant injected impurity charge at a bottom portion of the deep groove needs to be carefully processed. If polycrystalline or monocrystalline semiconductor epitaxy is used, a space depletion layer or a monocrystalline flaw needs to be well controlled, otherwise, it will cause severe reverse electric leakage.

In addition, for the direct epitaxy method, on one hand, a doping dose needs to be accurately controlled, and the accuracy needs to be definitely controlled within an impurity surface density from 1 cm$^{-2}$ to $2 \times 10^{11}$ cm$^{-2}$. On the other hand, it is also a difficulty to perfectly seal the deep groove without generating a flaw when monocrystalline is epitaxially grown in the deep groove, otherwise, it will also cause severe reverse electric leakage.

In conclusion, how to provide a high-voltage silicon power device with both of withstand voltage and low on-resistance and how to make it easier to implement the device in a manufacturing process have become a problem urgent to be resolved by those skilled in the art.

SUMMARY OF THE PRESENT INVENTION

In view of the disadvantages in the prior art described above, an objective consistent with the present invention is to provide a semiconductor cell structure and a power semiconductor device, to overcome deficiencies in the prior art when optimizing a breakdown voltage and on-resistance of a drift region that bears a withstand voltage and that is of a power semiconductor device.

In order to achieve the foregoing objective or other related technical objectives, the present invention provides the following technical solutions:

A semiconductor cell structure, at least comprising: a highly-doped semiconductor material region; an epitaxial layer formed on the highly-doped semiconductor material region; and an active device region formed on the epitaxial layer, where the epitaxial layer is provided with a deep groove, a dielectric insulating layer is formed on a side wall inside the deep groove, the deep groove is filled with a semi-insulating material, an electrode in contact with the semi-insulating material is formed above the semi-insulating material, and a bottom portion of the semi-insulating material is in contact with the highly-doped semiconductor material region.

Preferably, the deep groove vertically extends into the highly-doped semiconductor material region, so that an electric field may be optimally distributed.

Preferably, the highly-doped semiconductor material region and the epitaxial layer may be of a same conductive impurity type. This is because if conductive impurity types are different, although there is still a certain effect in this case, however, it generally causes the minority carrier injection, which causes an epitaxial layer carrier modulation effect.

Preferably, resistivity of the semi-insulating material is $1 \times 10^4 \Omega \cdot cm$ to $1 \times 10^{13} \Omega \cdot cm$.

Preferably, an impurity concentration of the epitaxial layer is higher than an impurity concentration of a drift region corresponding to a parallel-plane junction at a same operating voltage, to reduce on-resistance. This is because low on-resistance cannot be implemented without increasing the concentration, and resistance is further increased because of area occupation of the deep groove. This is a requirement for a basic low conduction function.

Preferably, the dielectric insulating layer is composed of a single layer of dielectric or a plurality of layers of dielectric, to satisfy the scope of actual applications.

Further, as further optimization of the foregoing invention and a preferable solution of the foregoing invention, an active region low-voltage electrode is formed above the active device region to serve as a low-voltage electrode of the semiconductor cell structure, wherein the highly-doped semiconductor material region correspondingly is a high-voltage electrode of the semiconductor cell structure.

In addition, the present invention further provides a power semiconductor device, wherein the power semiconductor device comprises any one of the semiconductor cell structures in the foregoing invention or the preferable solutions of the foregoing invention.

It should be noted that the high voltage herein should be understood as a positive high voltage or a negative high voltage. The active region low-voltage electrode is generally the lowest voltage when the cell blocks the high voltage. Using a typical VDMOS (vertical double diffusion metal oxide semiconductor) as an example, the active region low-voltage electrode is a source electrode or a gate electrode of the cell. When the active region low-voltage electrode is off, the cell is in a state of blocking high voltage or is in a state of turning off bearing high voltage. In this case, the gate electrode may be at a pinch-off voltage lower than that of the source electrode, or may be at a voltage the same as the source electrode. In this case, the cell is still in the state of turning off bearing high voltage. Therefore, an electrode on a top portion of a semi-insulating layer may be connected to the source electrode or the gate electrode. Generally, in consideration of the simplicity and reliability, the electrode on the top portion of the semi-insulating layer is directly connected to the source electrode. If the electrode is connected to the gate electrode, the load of the gate electrode is increased, which affects the on and off speed of the cell structure. However, the connection to the gate electrode has certain advantages for forward conduction during forward conduction, and the forward conduction resistance can be further reduced. Performance is basically the same when bearing high voltage is turned off in a reverse direction.

As described above, the present invention at least has the following beneficial effects.

1) It is easier to implement a process compared with other existing semiconductor cell structures of high voltage and low drift region on-resistance, and the costs are relatively lower.

2) Because the operating principle is that electric potential distribution of a resistive field plate forces electric field distribution of a drift region, an electric charge in a dielectric layer is better inhibited.

3) It reduces the difficulty of implementing an existing ordinary super junction electric charge balance process technology, and losses caused by charge mismatch at a same voltage, comprising mismatch caused by the electric charge in the dielectric layer. Using an example for description, for a cell structure of 600 V, a voltage of 5% ordinary super junction cell structure is reduced by about 50 V to 100 V. The cell structure in this solution is also reduced by 55 V, but the cell structure in this solution allows mismatch of 85% electric charges, which has great redundancy and benefits for reducing the difficulty of process implementation and process capabilities, and improving the yield. In addition, the stability of operation of the structure is improved.

4) It theoretically keeps specific on-resistance performance 10 times to 1000 times smaller than that of an ideal parallel-plane junction drift region at a same voltage, and actual performance is restricted by a capability of implementing the process.

DESCRIPTION OF COMPONENT MARK NUMBERS

Figure 1:
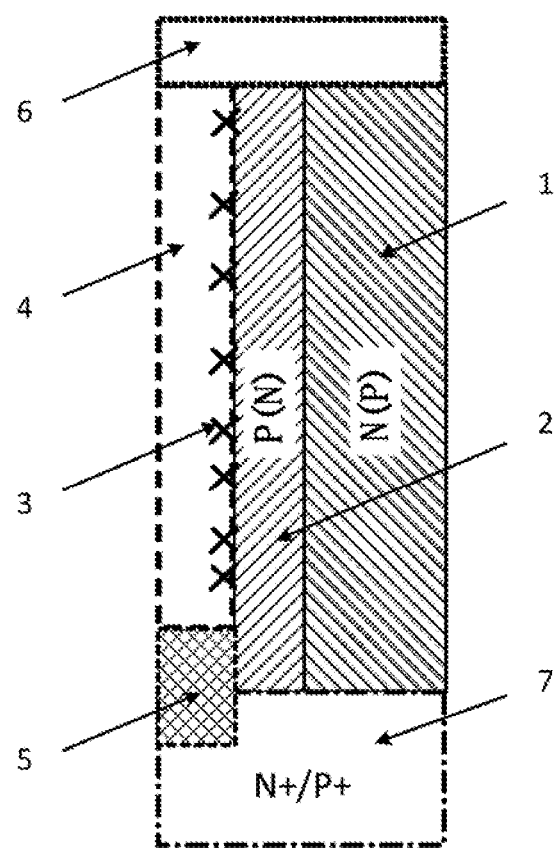
FIG. 1 is a schematic diagram of a semiconductor cell structure of a high voltage and low drift region on-resistance according to an existing technical solution.

101 Highly-doped semiconductor material region
102 Epitaxial layer
103 Dielectric insulating layer
104 Semi-insulating material
105 Active device region
106 Electrode
107 Active region low-voltage electrode
108 Oxide layer
109 Deep groove

DETAILED DESCRIPTION OF THE PREFERRED EMBODIMENTS

Implementations consistent with the present invention are described below with reference to specific embodiments, and those skilled in the art can easily understand other advantages and effects consistent with the present invention based on contents disclosed by this specification.

Refer to FIG. 2 to FIG. 5. It should be noted that the structures, proportions, sizes, and the like shown in the accompanying drawings of this specification are merely used for cooperating with the contents disclosed by this specification for understanding and reading by those skilled in the art and are not intended to set an limited condition for implementing the present invention. Therefore, the structures, proportions, sizes, and the like do not have substantial meanings technically. Any modification of the structures, change of a proportion relationship, or adjustment of the sizes without affecting the effects that can be generated and the objective that can be achieved by the present invention shall still fall within the scope that can be covered by the technical contents disclosed by the present invention. In addition, the terms such as "up", "down", "left", "right", "middle", and "one" cited in this specification are merely for convenience of description and are not intended to limit the implementable scope of the invention, and a change or adjustment of a relative relationship thereof without a substantial technical content change shall also be considered as the implementable scope of the present invention.

Figure 2:
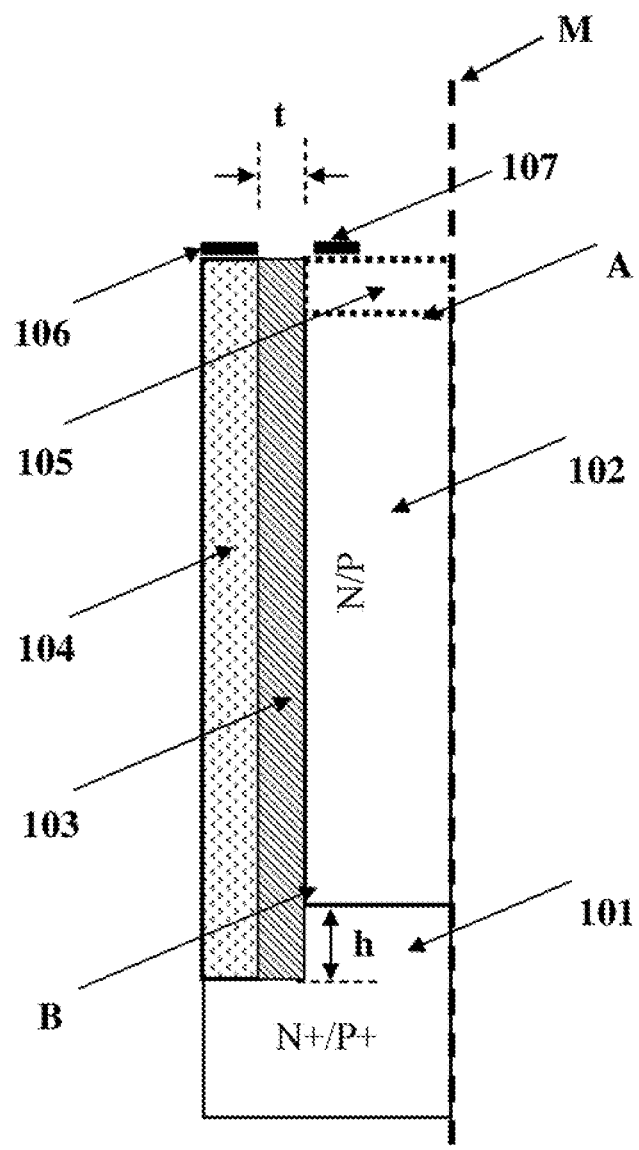
FIG. 2 is a schematic diagram of a semiconductor cell structure of a high voltage and low drift region on-resistance according to the present invention.

Referring to FIG. 2, FIG. 2 is a schematic diagram of the principle of a semiconductor cell structure of a high voltage and low drift region on-resistance. As shown in the figure, the semiconductor cell structure may comprise a highly-doped semiconductor material region 101, an epitaxial layer 102, a dielectric insulating layer 103, a semi-insulating material 104, an active device region 105, an electrode on a top portion of a semi-insulating layer 106, and an active region low-voltage electrode 107.

During specific implementation, the highly-doped semiconductor material region 101 and the epitaxial layer 102 may be of a same conductive impurity type. Generally, this is because only a same conductive impurity type needs to be mainly considered, and if conductive impurity types are different, it generally causes the minority carrier injection, which causes an epitaxial layer carrier modulation effect.

During specific implementation, the dielectric insulating layer 103 may be composed of a single layer of dielectric or a plurality of layers of dielectric. The dielectric insulating layer 103 extends through the epitaxial layer 102 in a vertical direction, and a bottom portion of the dielectric insulating layer extends into the highly-doped semiconductor material region 101.

During specific implementation, the semi-insulating material 104 is located at one side of the dielectric insulating layer 103, and vertically extends into the highly-doped semiconductor material region 101 with the dielectric insulating layer 103. A bottom portion of the semi-insulating material 104 is flush with the bottom portion of the dielectric insulating layer 103, and the bottom portion of the semi-insulating material 104 is in contact with the highly-doped semiconductor material region 101.

Specifically, the dielectric insulating layer 103 and the semi-insulating material 104 may be implemented by etching a deep groove 109 on the epitaxial layer 102, forming the dielectric insulating layer 103 on a side wall of the deep groove 109, and filling the deep groove 109 with the semi-insulating material 104.

During specific implementation, the highly-doped semiconductor material region 101 serves as a high-voltage electrode of the semiconductor cell structure of the high voltage and low drift region on-resistance at the same time. A low-voltage electrode corresponding to the highly-doped semiconductor material region is the active region low-voltage electrode 107 and the electrode on the top portion of the semi-insulating layer 106. In addition, the electrode on the top portion of the semi-insulating layer 106 and the active region low-voltage electrode 107 may be of a same electric potential.

During specific implementation, resistivity of the semi-insulating material 104 ranges from $1 \times 10^4 \Omega \cdot cm$ to $1 \times 10^{13} \Omega \cdot cm$, and an impurity concentration of the epitaxial layer 102 is higher than an impurity concentration of a drift region corresponding to a parallel-plane junction at a same operating voltage; otherwise the structure cannot reduce on-resistance. This is basic common sense in this technical field and is not further described herein. The impurity concentration may be theoretically as high as a maximum concentration of impurity solid solubility of a semiconductor material, and an actual concentration depends on a capability of implementing a process technology of the cell structure.

During specific implementation, a characteristic of optimal electric field distribution of the semiconductor cell structure of the high voltage and low drift region on-resistance is: the cell structure has the optimal effect when the highest electric field of the active device region 105 near a position A at a reverse high voltage is nearly equal to the highest electric field at a position B that is an intersection of the epitaxial layer 102, the dielectric insulating layer 103, and the highly-doped semiconductor material region 101 and that is on the side of epitaxial layer 102.

During specific implementation, a depth h by which the dielectric insulating layer 103 and the semi-insulating material 104 vertically extend into the epitaxial layer 102 is related to a thickness t of the dielectric insulating layer 103. A general tendency is that a thinner thickness t of the dielectric insulating layer 103 indicates a shallower depth h. In an extreme case, the depth h is zero, that is, the thickness t of the dielectric insulating layer 103 is in a sublinear relationship with the depth h by which the dielectric insulating layer 103 and the semi-insulating material 104 vertically extend into the epitaxial layer 102. In an extreme case, the bottom portions of the dielectric insulating layer 103 and the semi-insulating material 104 are flush with a bottom portion of the epitaxial layer 102.

During specific implementation, for different operating voltages, a specific optimal cell size structure is calculated and determined in a simulated manner by combining process simulation software with process implementation capability.

It should be noted that the high voltage herein should be understood as a positive high voltage or a negative high voltage. The active region low-voltage electrode 107 is generally the lowest voltage when the cell blocks the high voltage. Using a typical VDMOS as an example, the active region low-voltage electrode 107 is a source electrode or a gate electrode of the cell. When the active region low-voltage electrode 107 is off, the cell is in a state of blocking high voltage or is in a state of turning off bearing high voltage. In this case, the gate electrode may be at a pinch-off voltage lower than that of the source electrode, or may be at a voltage the same as the source electrode. In this case, the cell is still in the state of turning off and bearing high voltage. Therefore, the electrode 106 on the top portion of the semi-insulating layer may be connected to the source electrode or the gate electrode. Generally, in consideration of the simplicity and reliability, the electrode 106 on the top portion of the semi-insulating layer is directly connected to the source electrode. If the electrode is connected to the gate electrode, the load of the gate electrode is increased, which affects the on and off speed of the cell structure. However, the connection to the gate electrode has certain advantages for forward conduction during forward conduction, and the forward conduction resistance can be further reduced. Performance is basically the same when bearing high voltage is turned off in a reverse direction.

It should be further noted that the semiconductor cell structure of a high voltage and low drift region on-resistance in FIG. 2 is only a half of a bilaterally symmetrical structure. A complete semiconductor cell structure of a high voltage and low drift region on-resistance is obtained by simply performing bilaterally mirror (as shown in FIG. 2, M is a mirror) symmetry.

In order to make those skilled in the art better understand the foregoing solutions, the foregoing solutions will be described in detail by using an example in the following.

An example in which the active device region 105 is a simplest PN junction diode cell structure that withstands a voltage of 600 V is used to describe implementations of this technical solution. Other embodiments having features described in this cell structure other than diodes should not be considered as different cell structures. The active device region 105 herein may alternatively be a semiconductor cell structure such as a bipolar transistor, an MOSFET, a VDMOS, or an IGBT that can use this cell structure to achieve high voltage and low drift region on-resistance performance.

The following uses a silicon diode with the simplest structure as an example for specific description.

1. Based on a requirement on withstanding a voltage of 600 V by a diode, in combination with the process implementation capability, cell structure simulation is performed by using semiconductor device simulation tool software common used in the industry. It is assumed that a basic process capability can be used to etch a deep groove having a width of 3 µm and 40 µm, and parameters of the semiconductor cell structure of a high voltage and low drift region on-resistance are obtained as follows:

1) The deep groove has a depth of 40 µm and a width of 3 µm, and the highly-doped semiconductor material region 101 has a depth h of 3 µm.

2) The epitaxial layer 102 has a thickness of 37 µm and an N-type doping concentration is $2.8 \times 10^{15}$ cm$^{-3}$.

3) The epitaxial layer 102 has a lateral width of 5 µm.

4) The dielectric insulating layer 103 has a thickness t of 300 nm.

5) Resistivity of the highly-doped semiconductor material region 101 is 0.02Ω·cm to 0.001Ω·cm, and an N-type <100> silicon material.

In this case, the diode cell structure can bear a withstand voltage of 623 V and specific on-resistance of 10 mΩ·cm$^2$. The specific on-resistance of the diode cell structure is 6.5 times less than that of an ideal parallel-plane junction bearing a same withstand voltage, and is slightly better than 5 times of a level of an ordinary super junction cell structure.

2. After design of the foregoing cell structure is completed, a photoetching alignment mark is formed on an N-type <100> silicon material of 0.02Ω·cm to 0.001 Ω·cm by using a method common in the industry. At the same time, the silicon material serves as the highly-doped semiconductor material region 101.

Figure 3:
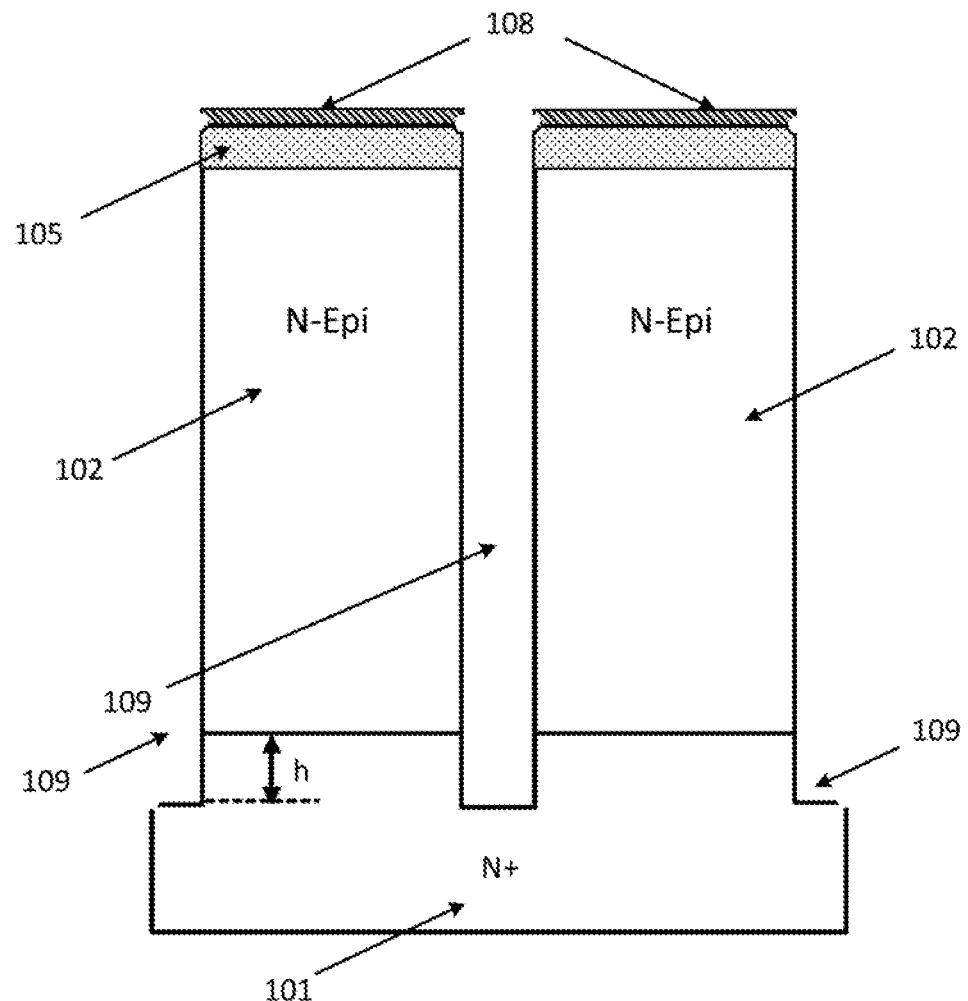
FIG. 3 is a schematic diagram of growing an N− epitaxial layer on an N+ highly-doped semiconductor material region, and forming P-type doping on a surface of the N-epitaxial layer to serve as an active device region, growing an oxide layer, and obtaining a deep groove by photoetching and etching according to an embodiment of the present invention.

3. An N-type epitaxial layer 102 is grown on the foregoing silicon wafer by using an epitaxial method common in the industry, and a doping concentration thereof is $2.8 \times 10^{15}$/cm$^3$ determined by the foregoing design value. In the region where the surface P-type doping is required to be formed, it is implemented in an overlay adhesive ion implantation manner, a concentration thereof is greater than $1 \times 10^{19}$/cm$^3$, and a PN junction formed with the epitaxial layer 102 has a depth of 0.1 µm to 2 µm. The PN junction serves as the active device region 105. An oxide layer of 40 nm is formed through thermal oxidation common in the industry. An oxide layer 108 is then formed by depositing an oxide layer of 500 nm through LPCVD to serve as a hard mask of deep groove etching. A picture of a to-be-etched deep groove is exposed and developed through general photolithography, and a deep groove 109 is etched on the epitaxial layer 102 by using a highly-anisotropic dry etching machine, as shown in FIG. 3.

Figure 4:
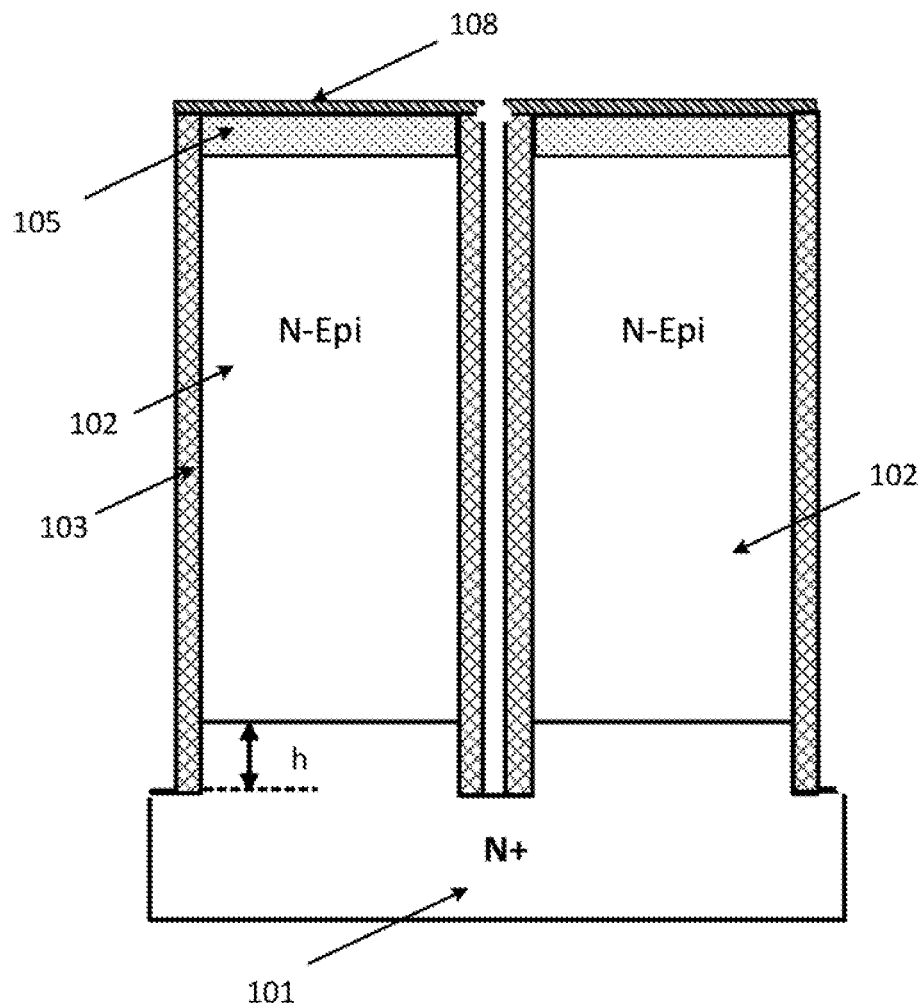
FIG. 4 is a schematic diagram of forming an oxide layer on a side wall of the deep groove on a silicon wafer in FIG. 3 and etching an oxide layer on a bottom portion of the deep groove by using an anisotropic dry method according to the present invention.

4. After step 3 is completed, the silicon wafer is cleaned by using a cleaning procedure common in the industry. Thermal oxidation is performed or an oxide layer is deposited on a side wall of the deep groove in a thermal oxidation or CVD manner, and the oxide layer has a thickness of 300 nm. An oxide layer on a bottom portion of the deep groove is then etched through highly-anisotropic dry etching and an oxide layer on the side wall of the deep groove is reserved, to form the dielectric insulating layer 103, as shown in FIG. 4.

Figure 5:
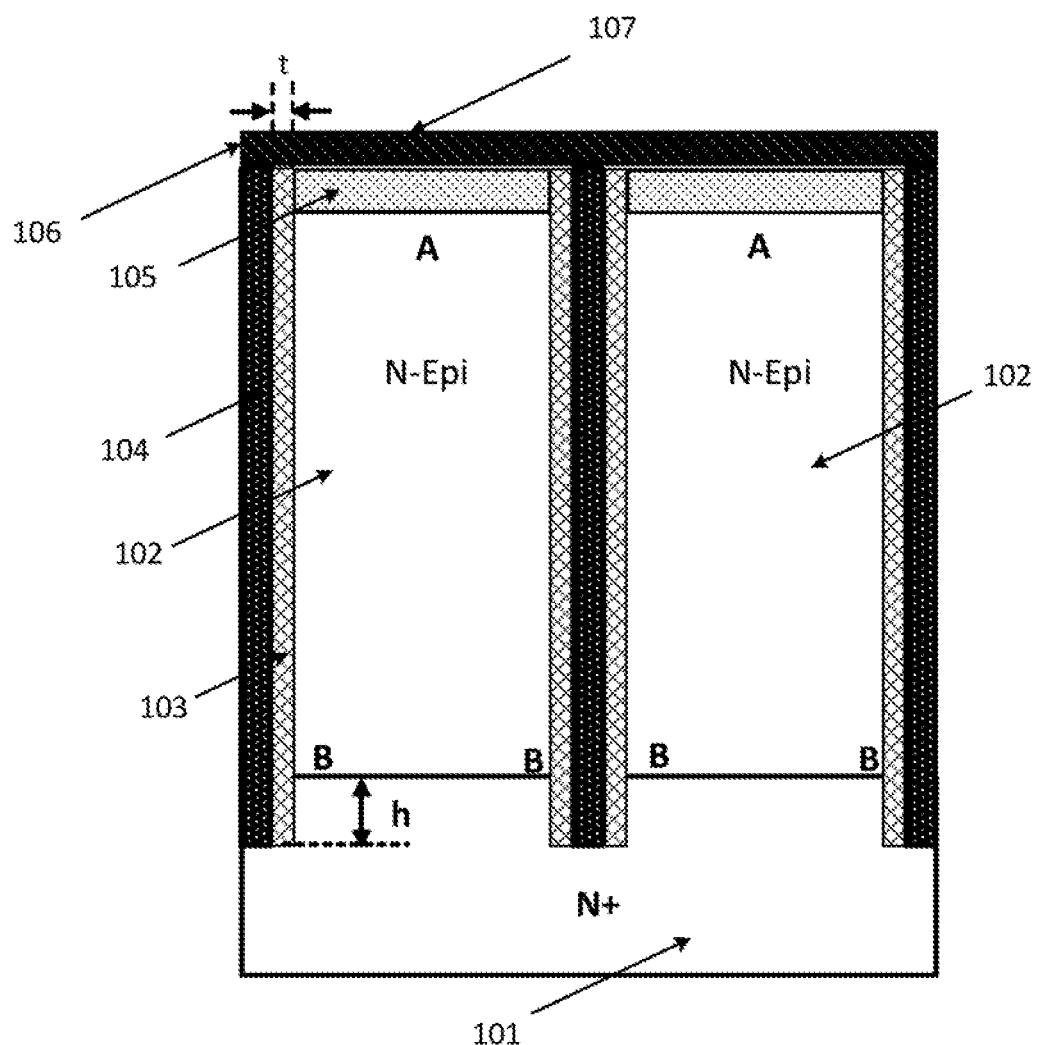
FIG. 5 is a schematic diagram of growing a semi-insulating material on the deep groove on the silicon wafer in FIG. 4, and removing the semi-insulating material and the oxide layer on a surface of the deep groove to form an active region low-voltage electrode for connecting the semi-insulating material electrode and an active device region according to the present invention.

5. A semi-insulating polycrystalline silicon layer is deposited on the silicon wafer in step 4 in an LPCVD manner common in the industry. The semi-insulating polycrystalline silicon layer needs to be as thick as to fill the deep groove, and a specific value of the thickness is 1.8 µm. The deposition of the semi-insulating polycrystalline silicon may be completed in three times. Resistivity of the semi-insulating polycrystalline silicon ranges from $1 \times 10^8$ Ω·cm to $1 \times 10^{10}$ Ω·cm. The deep groove is sealed or fully filled after the deposition of the semi-insulating polycrystalline silicon is completed. If a semi-insulating filling gap exists in the deep groove, it will cause subtle but not serious impact to the cell structure, the semi-insulating polycrystalline silicon layer serves as the semi-insulating material 104. Subsequently, the semi-insulating polycrystalline silicon on a surface of the silicon wafer is removed in a CMP or dry etching manner, an oxide layer on the surface is then removed, and finally surface metal electrodes 106 and 107 are formed through sputtering or evaporation common in the industry. Alloying processing common in the industry is then performed, and manufacturing of the cell structure is finally completed, as shown in FIG. 5.

If a process capability, especially a deep groove etching process capability is quite strong, it is assumed that the basic process capability can be further used to etch a deep groove having a width of 2 µm and a depth of 45 µm, and a new set of parameters of the semiconductor cell structure of a high voltage and low drift region on-resistance are obtained as follows:

1) The deep groove has a depth of 45 µm and a width of 2 µm, and the highly-doped semiconductor material region 101 has a depth h of 3 µm.

2) The epitaxial layer 102 has a thickness of 42 µm and an N-type doping concentration is $1.68 \times 10^{16}$ cm$^{-3}$.

3) The epitaxial layer 102 has a lateral width of 1 µm.

4) The dielectric insulating layer 103 has a thickness t of 500 nm.

In this case, the diode cell structure can bear a withstand voltage of 628 V and specific on-resistance of 5.44 mΩ·cm$^2$. The specific on-resistance of the diode cell structure is 13 times less than that of an ideal parallel-plane junction bearing a same withstand voltage, and is much better than 5 times of performance of an ordinary super junction cell structure.

It should be noted that, the foregoing semiconductor cell structure may be applied to a power semiconductor device to obtain a power semiconductor device that can bear a higher drift region breakdown voltage and that has lower on-resistance.

In conclusion, the semiconductor cell structure provided in the present invention at least has the following advantages.

1) The process is easier to implement than other existing semiconductor cell structures of high voltage and low drift region on-resistance, and costs are relatively lower.

2) Because the operating principle of the semiconductor cell structure is that electric potential distribution of a resistive field plate forces electric field distribution of a drift region, an electric charge in a dielectric layer is better inhibited.

3) It reduces the difficulty of implementing an existing ordinary super junction electric charge balance process technology, and losses caused by charge mismatch at a same voltage, comprising mismatch caused by the electric charge in the dielectric layer. Using an example for description, for a cell structure of 600 V, a voltage of 5% ordinary super junction cell structure is reduced by about 50 V to 100 V. The cell structure in this solution is also reduced by 55 V, but the cell structure in this solution allows mismatch of 85% electric charges, which has great redundancy and benefits for reducing the difficulty of process implementation and process capabilities, and improving the yield. In addition, the stability of operation of the structure is improved.

4) It theoretically keeps specific on-resistance performance 10 times to 1000 times smaller than that of an ideal parallel-plane junction at a same voltage, and actual performance is restricted by a capability of implementing the process.

The foregoing embodiments merely exemplarily describe the principle and effect consistent with the present invention, and are not intended to limit the present invention. One skilled in the art can make modifications or changes to the foregoing embodiments without departing from the spirit and scope consistent with the present invention. Therefore, all equivalent modifications or changes made by those who have common knowledge in the art without departing from the spirit and technical idea disclosed in the present invention shall still be covered by the claims consistent with the present invention.

What is claimed is:

1. A semiconductor cell structure, at least comprising:
a highly-doped semiconductor material region (101);
an epitaxial layer (102) formed on the highly-doped semiconductor material region (101);
an active device region (105) formed on the epitaxial layer (102);
the epitaxial layer (102) is provided with a deep groove (109), the deep groove (109) vertically extends into the highly-doped semiconductor material region (101), a dielectric insulating layer (103) is formed on a side wall inside the deep groove (109), the deep groove (109) is filled with a semi-insulating material (104);
an electrode (106) in contact with the semi-insulating material (104) is formed above the semi-insulating material (104), and a bottom portion of the semi-insulating material (104) is in contact with the highly-doped semiconductor material region (101);
wherein, the highly-doped semiconductor material region 101 is N+ type, the epitaxial layer 102 is N− type; when the highly-doped semiconductor material region 101 is P+ type, the epitaxial layer 102 is P− type,
wherein, the bottom portion of the semi-insulating material (104) and a bottom portion of the dielectric insulating layer (103) vertically extend into the highly doped semiconductor material region (101) at a same depth of h;
wherein, a thickness t of the dielectric insulating layer 103 is in a sublinear relationship with the depth h.

2. The semiconductor cell structure as in claim 1, wherein the highly-doped semiconductor material region (101) and the epitaxial layer (102) are of a same conductive impurity type.

3. The semiconductor cell structure as in claim 1, wherein resistivity of the semi-insulating material (104) is $1\times10^4 \Omega \cdot cm$ to $1\times10^{13} \Omega \cdot cm$.

4. The semiconductor cell structure as in claim 1, wherein an impurity concentration of the epitaxial layer (102) is higher than an impurity concentration of a drift region corresponding to a parallel-plane junction at a same operating voltage.

5. The semiconductor cell structure as in claim 1, wherein the dielectric insulating layer (103) is composed of a single layer of dielectric or a plurality of layers of dielectric.

6. The semiconductor cell structure as in claim 1, wherein an active region low-voltage electrode (107) is formed above the active device region (105) to serve as a low-voltage electrode of the semiconductor cell structure, wherein the highly-doped semiconductor material region (101) correspondingly is a high-voltage electrode of the semiconductor cell structure.

7. A power semiconductor device, wherein the power semiconductor device comprises the semiconductor cell structure as in claim 1.

* * * * *